April 21, 1959 J. I. PANKOVE 2,883,313

SEMICONDUCTOR DEVICES

Filed Aug. 16, 1954

INVENTOR.
JACQUES I. PANKOVE
BY
J. L. Whittaker
ATTORNEY

United States Patent Office 2,883,313

Patented Apr. 21, 1959

2,883,313

SEMICONDUCTOR DEVICES

Jacques I. Pankove, Princeton, N.J., assignor to Radio Corporation of America, a corporation of Delaware Application August 16, 1954, Serial No. 450,197

6 Claims. (Cl. 148—33)

Figure 1:
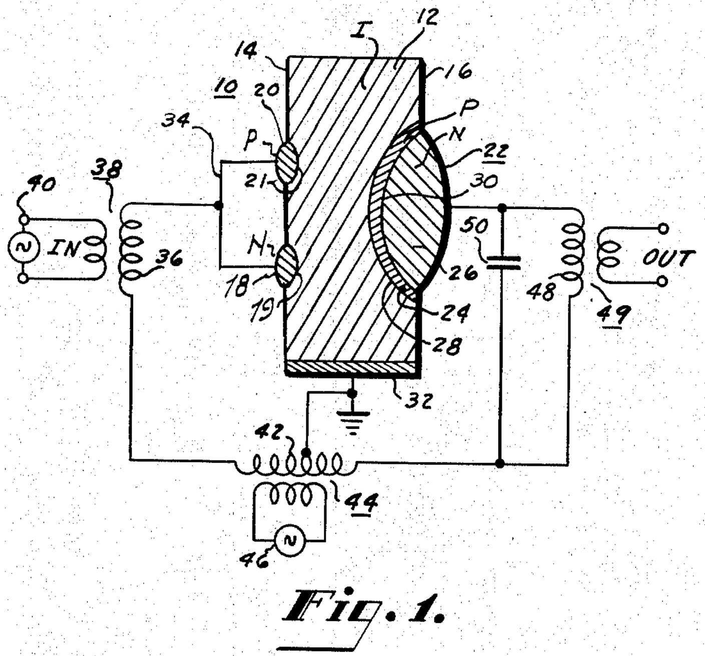

This invention pertains to semiconductor devices and particularly to improved composite multi-electrode semiconductor devices and systems in which they may be employed.

Semiconductor devices which may be employed as oscillators, amplifiers or the like are of many varieties. One of the most common types is known as a triode transistor and comprises a body of semiconductor material having two rectifying electrodes in contact therewith. One of the rectifying electrodes is operated as an input or emitter electrode and injects minority charge carriers into the semiconductor body, said carriers being collected by the other rectifying electrode which is operated as an output or collector electrode. A base electrode is generally connected in ohmic contact with the semiconductor body and serves to control the potential of the body and, thereby to control the emitter-to-collector current flow.

The foregoing devices have certain characteristics which, while they do not seriously affect the utility of these devices as amplifiers or the like, do represent certain limitations which are overcome by the present invention. For example, the foregoing devices are designed to inject, into the semiconductor crystal or body, only one type of carrier, that is, either holes or electrons and to collect only this one type of carrier. In addition, in such devices, in order to provide the desired operation, the input and output electrodes must be properly electrically biased with respect to each other and to the semiconductor body. In such devices, the required bias voltages are D.C. voltages and are generally supplied by means of separate batteries which represent a component of the cost and the bulk of the equipment in which they are employed which it would be desirable to reduce. This aspect of the problem is particularly evident where a plurality of such devices are cascaded and where each device requires a separate bias battery for its emitter and collector electrodes.

Accordingly, an important object of this invention is to provide a semiconductor device of new and improved form.

A further object of this invention is to provide an improved multi-electrode semiconductor device.

Another object of this invention is to provide an improved semiconductor device adapted to operate with input injection of both holes and electrons.

A further object of this invention is to provide an improved semiconductor device adapted to operate with out D.C. bias voltage sources.

Another object is to provide an improved method of and means for biasing a semiconductor translating device with alternating potentials.

Still another object of this invention is to provide an improved semiconductor device adapted to operate in cascade connection without separate bias of the cascade arrangement.

In general, the principles and objects of this invention are accomplished in a semiconductor device including a body of intrinsic semiconductor material having a "hook" or double-junction electrode, and a hole-injecting electrode, and an electron-injecting electrode in contact therewith. With this structural arrangement, an alternating voltage source is employed to alternately bias the hole and electron-injecting electrodes in the injecting state while the same source concurrently biases one or the other of the two junctions of the hook electrode in the proper polarity to collect one type or the other type of the injected carriers. Thus while the electron or hole-injecting emitter is biased to inject, the proper junction of the hook-collector is properly biased to collect.

Figure 2:
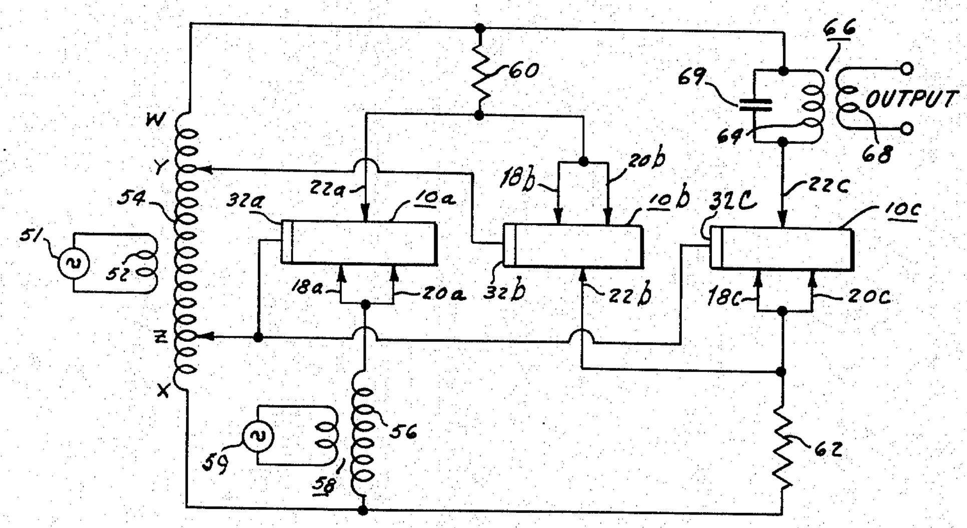

The invention is described in greater detail by reference to the drawing wherein:

Fig. 1 is a sectional elevational view of a device embodying the principles of the invention and a schematic representation of a circuit in which it may be operated; and, Fig. 2 is a schematic representation of devices of the type shown in Fig. 1 and a schematic representation of a typical cascade arrangement in which they may be employed.

Similar elements are designated by similar reference characters throughout the drawing.

Referring to Figure 1, a semiconductor device 10 embodying the principles of the invention includes a body 12 of substantially intrinsic semiconductor material having substantially plane, parallel surfaces 14 and 16. An electron-emitting electrode 18 and a hole-emitting electrode 20 are provided in rectifying contact with the crystal 12 and preferably on the same surface thereof, for example surface 14. The electrodes 18 and 20 may be positioned as close together as desired. The electrodes 18 and 20 may comprise surface barrier electrodes of the point or line contact variety or they may be comparatively large area plates or films or the like of the type shown in U.S. Patent 2,634,322. The electrodes 18 and 20 may also be regions of N-type and P-type semiconductor material, respectively, separated from the bulk of the crystal 12 by rectifying barriers 19 and 21, respectively, as shown. These P-type and N-type regions may be formed generally according to an alloying or fusion method described in an article by Law et al. entitled "A Developmental Germanium P–N–P Junction Transistor" appearing on pages 1352–1357 of the Proceedings of the IRE of November 1952, volume 40, Number 11.

In order to form the P-type region 20 any one of indium, gallium, aluminum, zinc or boron, for example, may be used as the impurity alloying material. In order to form the N-type region 18, any one of phosphorus, arsenic, sulfur, selenium, tellurium, antimony or bismuth, for example, may be used as the impurity alloying material.

The body 12 is also provided with a double-junction electrode 22, preferably in the surface 16 and substantially opposite the electrodes 18 and 20. The double-junction electrode comprises regions 24 and 26 of P-type and N-type semiconductor material, respectively, with the P-type region separated from the crystal by a rectifying barrier 28 and the N-type region being separated from the P-type region by a barrier 30. The double-junction electrode should be as close to the electrodes 18 and 20 as possible to achieve good high frequency operation and its length should be greater than the distance between the outer edges of eelctrodes 18 and 20 to achieve good charge carrier collection.

The double junction electrode 22 may be produced within the semiconductor body 12 by the above-mentioned alloying technique. Broadly, this is accomplished by fusing a mixture of two opposite conductivity type-determining impurity materials to the semiconductor body. For example, an impurity pellet consisting of an alloy of gallium and antimony, P-type and N-type determining materials, respectively, is placed upon the surface 16 of the crystal 12 and the assembly is heated in a non-oxidizing atmosphere at a temperature in the range of 800° C. to 850° C. for about five minutes to melt the pellet and to cause it to alloy with the crystal to form the double-junction electrode. Because of the effect of the two opposite conductivity type-determining impurity materials in the pellet, there are formed the two regions 24 and 26 of opposite conductivity types and the two spaced rectifying junctions 28 and 30.

Although it is not known definitely why an alloy of opposite conductivity-type determining impurity materials will produce two spaced P–N rectifying junctions when fused to a semiconductor body, it is believed that such action is dependent partly upon the difference between the segregation coefficients of the two impurity materials in the alloy and partly upon the difference between the diffusion coefficients of the two impurity materials.

The term segregation coefficient is a quantitative expression for a phenomenon of freezing. As a molten mass of a material containing dissolved impurities is slowly frozen longitudinally a difference occurs between the impurity concentrations in the liquid and in the solid in regions adjacent the freezing front. The segregation coefficient may be defined as the ratio between these concentrations ($k$=concentration in solid/concentration in liquid).

The effect of the difference is segregation coefficients in the practice of the present invention may most easily be explained as follows:

When the alloy comprising the impurity-yielding materials is heated above its melting point it dissolves a portion of the germanium, and, as it is cooled, the dissolved germanium recrystallizes, largely upon the crystal structure of the wafer. As the germanium recrystallizes, the material having the higher segregation coefficient is at first included in the recrystallized region preferentially to the material having a lower segregation coefficient. As the recrystallization continues a difference in concentration of the two impurity materials develops in the liquid at the recrystallizing surface due to the preferential inclusion of the higher segregation coefficient material in the recrystallized region. This difference in concentration produces a relative excess of the lower segregation coefficient material at the recrystallizing surface and results in a net excess of the lower segregation coefficient material being included in the later formed portion of the recrystallized region.

In the example described above, gallium, a P-type impurity, has a higher segregation coefficient than does antimony, an N-type impurity, and therefore is included preferentially in the first formed portion of the recrystallized region 24. As the recrystallized region continues to form, the relative concentration of antimony increases at the recrystallizing surface and the later formed portion 26 of the recrystallized region includes an excess of antimony impurities over gallium impurities.

There is thus formed in the wafer the rectifying junction 28 disposed between the intrinsic material of the body 12 and the gallium-rich P-type portion of the recrystallized region. There is also formed the second rectifying junction 30 within the recrystallized region disposed between the first formed and the later formed portions 24 and 26, respectively, of the region.

The term diffusion coefficient is sufficiently well known and self-descriptive not to require a detailed explanation herein.

The effect of a difference in diffusion coefficients may most easily be explained as follows, disregarding entirely the effect of a difference between the segregation coefficients:

When the alloy and wafer are heated to a temperature above the melting point of the alloy, the materials of the alloy diffuse into the wafer. The material having the higher diffusion coefficient diffuses deeper into the wafer than does the material having the lower diffusion coefficient.

It should be understood that the present invention is not limited to the specific example described in connection with the preferred embodiment, but includes broadly the production of a device having a double-junction electrode by means of alloying to a semiconductor body of one conductivity type a mixture of two opposite conductivity type-determining impurities.

The two materials in the mixture should have different segregation coefficients, and the material having the greater segregation coefficient should yield impurities of the conductivity type different from or opposite to that of the semiconductor body to which the mixture is alloyed.

For example, mixtures of antimony and thallium, or of bismuth and thallium may be alloyed to a body of semiconductor material to form a double-junction electrode. In a similar manner mixtures of indium and antimony, aluminum and antimony, or gallium and arsenic may be similarly employed.

As an alternative method of preparing the double junction electrode, the selected impurity materials, e.g. gallium and antimony may be evaporated onto the surface of the crystal 12 and then diffused into the body of the crystal to provide the desired P-type and N-type regions 24 and 26, respectively.

The body 12 is also provided with a base electrode 32 in ohmic (non-rectifying) contact therewith.

The device 10 may be operated in a circuit of the type shown in Figure 1. In such a circuit, the emitter electrodes 18 and 20 are connected to each other by a lead 34 which is connected, in turn, to one end of the secondary winding 36 of a transformer 38 which has an input signal source 40 connected across its primary winding. The other end of the secondary winding 36 is connected to the secondary winding 42 of a second or bias transformer 44 which has an alternating bias voltage source 46 connected across its primary winding. The other end of the secondary winding 42 is connected to one end of the secondary winding 48 of an output transformer 49, the other end of the secondary winding thereof being connected to the hook electrode 22. The frequencies of the signals from the sources 40 and 46 are preferably widely spaced so that filtering out of the bias voltage is simplified. For example, if the signal from the source 40 is voice, music or the like in the range of 30 to 15,000 cycles, the bias voltage from the source 46 may have a frequency of the order of 100 kilocycles. The 100 kilocycle signal may be filtered out by a capacitor 50 placed across the winding 48 or by means of a suitable filter network (not shown) in the secondary circuit of the transformer 49.

The base electrode 32 is connected to a source of reference potential such as ground and to the midpoint of the secondary winding 42 of the bias transformer 44.

In operation of the device 10 in such a circuit, the voltage applied to the electrodes 18 and 20 by the A.C. bias transformer 44 biases said electrodes, in turn, in the charge-injecting state. For example at one instant, when the electrodes 18 and 20 are electrically positive, then the electrode 20 is biased in the injecting state. At the same instant, the electrode 22 is biased negative and the P-type region is thus biased in the reverse direction with respect to the body 12 and acts as the collector electrode. At the same time, the signal applied to the electrode 20 from the source 40 modulates the charge injection by the electrode 20. On the reverse portion of the bias voltage cycle, the electrodes 18 and 20 are biased negatively and the electrode 18 becomes the emitter. At the same instant, the electrode 22 is biased positively and the P–N junction 30 is biased in the reverse direction and provides the desired collector action. Charge injection from the electrode 18 is also modulated by the signal from the source 40.

On the portion of the operating cycle when the double junction electrode is negative and the P-type region 24 operates as the collector, a hook-type of action is provided by the electrode 22. In order to insure that the outputs of the collector under both polarities of bias are balanced, the hook is designed to have a current gain of unity. This may be achieved by properly controlling the resistivities of both recrystallized regions 24 and 26, or the thickness of region 24 or, alternatively it may be accomplished by connecting an appropriate resistance between the P-type and N-type regions 24 and 26 according to the teaching in U.S. Patent 2,655,610 of J. J. Ebers.

Referring to Figure 2, there is shown one suitable circuit to illustrate the convenience of cascading a plurality of transistors of the type shown in Figure 1. The circuit includes transistors 10*a*, 10*b* and 10*c*. The transistor 10*a* includes a base electrode 32*a*, two emitter electrodes 18*a* and 20*a* and a double-junction collector electrode 22*a*.

The transistor 10*b* includes a base electrode 32*b*, emitter electrodes 18*b* and 20*b* and a double-junction collector electrode 22*b*. The transistor 10*c* includes a base electrode 32*c*, emitter electrodes 18*c* and 20*c* and a double-junction collector electrode 22*c*.

The bias voltages for operating the transistors 10*a*, 10*b*, and 10*c* are obtained from an alternating (preferably sinusoidal and at a frequency of 100 kilocycles) voltage source 51 connected across the primary winding 52 of a transformer which includes a secondary winding 54 having end points W and X and intermediate tap points Y and Z.

The emitter electrodes 18*a* and 20*a* of the transistor 10*a* are connected together and are connected through the secondary winding 56 of a signal input transformer 58 to one end point X of the secondary winding 54 of the bias transformer. An input signal source 59 (voice, music, or the like) is coupled through a transformer to the emitter. The base electrode 32*a* is connected to a point Z on the secondary winding of the bias transformer. Thus, an appropriate small varying bias voltage is applied between the emitter electrodes and the base electrode. The collector electrode 22*a* is connected through a load impdance 60 to the end point W of the secondary winding 54. Thus, an appropriate large bias voltage is applied between the collector 22*a* and the base electrode 32*a*. With respect to transistor 10*b*, the base electrode 32*b* is connected to an intermediate point Y on the secondary bias winding 54 and the emitter electrodes 18*b* and 20*b* are connected to the collector electrode 22*a* of transistor 10*a* and thereby are connected through the load impedance 60 to the bias point W on the winding. Thus, the appropriate small bias voltage is connected between the emitter electrodes 18*b* and 20*b* and the base electrode 32*b*. The collector electrode 22*b* is connected through a load impedance 62 to the terminal X on the bias winding 54 whereby the appropriate large bias voltage is connected between it and the base electrode 32*b*.

With respect to the third transistor 10*c*, the base electrode 32*c* is connected to the bias point Z, the emitter electrodes 18*c* and 20*c* are connected together and are coupled to the collector electrode 22*b* of transistor 10*b* and are also coupled through the impedance 62 to the bias point X. The collector electrode 22*c* is connected through the primary winding 64 of an output transformer 66 to the point W on the bias winding. The secondary winding 68 of the output transformer is coupled to any suitable load circuit or utilization circuit (not shown). Filtering of the bias voltage may be achieved by a filter capacitor 69 placed across the primary winding 64 or in any other suitable fashion.

In operation of the cascaded transistors 10*a*, 10*b* and 10*c*, thus appropriately biased, a signal from the source 59 is transmitted from the collector circuit of one amplifying stage to the emitter circuit of the following amplifying stage. The signal is a composite of the input signal and the alternating bias voltage which may be considered to be in the nature of a carrier signal and which is filtered out of the transmitted signal in the output circuit connected to transformer 66.

What is claimed is:

1. A semiconductor device comprising a body of substantially intrinsic semiconductor material having two opposed faces, a first hole-injecting electrode integral with one face of said body, a second electron-injecting electrode integral with said one face of said body, and a double-junction electrode integral and in rectifying contact with the other face of said body.

2. A semiconductor device comprising a body of substantially intrinsic semiconductor material having two opposed faces, a first hole-injecting electrode integral with one face of said body, a second electron-injecting electrode integral with said one face of said body, and a double-junction electrode integral and in rectifying contact with the other face of said body, said double-junction electrode comprising a pair of serially-connected zones of different conductivity type.

3. A semiconductor device comprising a body of substantially intrinsic semiconductor material having two opposed faces, a first hole-injecting electrode integral with one face of said body, a second electron-injecting electrode integral with said one face of said body, and a double-junction electrode integral and in rectifying contact with the other face of said body, said double-junction electrode comprising a pair of serially-connected zones of different conductivity type material, one of said zones being separated from said body by a first rectifying barrier and the other of said zones being separated from said one of said zones by a second rectifying barrier.

4. A semiconductor device comprising a wafer of substantially intrinsic semiconductive material, a hook collector electrode alloyed upon one surface of said wafer, and a pair of rectifying electrodes alloyed upon a surface of said wafer opposite said one surface, one electrode of said pair being capable of injecting positive charge carriers into said wafer, and the other electrode of said pair being capable of injecting negative charge carriers into said wafer.

5. A semiconductor device comprising a wafer of semiconductive germanium of substantially intrinsic conductivity and having two substantially parallel faces, a hook electrode surface alloyed upon one face of said wafer, a first and a second single-junction electrode surface alloyed upon the opposite face of said wafer, said first single-junction electrode being capable of injecting positive charge carriers into said wafer, and said second single-junction electrode being capable of injecting negative charge carriers into said wafer.

6. A semiconductor device comprising a wafer of semiconductive germanium of substantially intrinsic conductivity and having two substantially parallel faces, a hook electrode surface alloyed upon one face of said wafer, a first and a second single-junction electrode surface alloyed upon the opposite face of said wafer, said first single-junction electrode being capable of injecting positive charge carriers into said wafer, and said second single-junction electrode being capable of injecting negative charge carriers into said wafer, said first and second single-junction electrodes being symmetrically aligned with respect to the axis of said hook electrode normal to the faces of said wafer.

References Cited in the file of this patent

UNITED STATES PATENTS

| | | |
|---|---|---|
| 2,486,776 | Barney | Nov. 1, 1949 |
| 2,569,347 | Shockley | Sept. 25, 1951 |
| 2,623,105 | Shockley | Dec. 23, 1952 |
| 2,663,767 | Reeves | Dec. 22, 1953 |
| 2,663,830 | Oliver | Dec. 22, 1953 |
| 2,666,816 | Hunter | Jan. 19, 1954 |
| 2,666,818 | Shockley | Jan. 19, 1954 |
| 2,691,073 | Lowman | Oct. 5, 1954 |
| 2,742,383 | Barnes | Apr. 17, 1956 |
| 2,748,041 | Leverenz | May 29, 1956 |
| 2,754,431 | Johnson | July 10, 1956 |
| 2,767,358 | Early | Oct. 16, 1956 |
| 2,790,037 | Shockley | Apr. 23, 1957 |

FOREIGN PATENTS

| | | |
|---|---|---|
| 665,867 | Great Britain | Jan. 30, 1952 |
| 1,113,385 | France | Dec. 5, 1955 |
| 1,114,367 | France | Dec. 19, 1955 |